United States Patent
Kang et al.

(10) Patent No.: US 8,237,181 B2
(45) Date of Patent: Aug. 7, 2012

(54) SEMICONDUCTOR LIGHT EMITTING DEVICE AND METHOD OF MANUFACTURING THE SAME

(75) Inventors: Dae Sung Kang, Gwangju (KR); Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 238 days.

(21) Appl. No.: 12/187,970

(22) Filed: Aug. 7, 2008

(65) Prior Publication Data

US 2009/0039363 A1    Feb. 12, 2009

(30) Foreign Application Priority Data

Aug. 9, 2007    (KR) .................. 10-2007-0080102

(51) Int. Cl.
*H01L 33/00* (2010.01)
(52) U.S. Cl. .......................... 257/97; 257/94
(58) Field of Classification Search ............ 257/94, 257/97
See application file for complete search history.

(56) References Cited

U.S. PATENT DOCUMENTS

| | | | |
|---|---|---|---|
| 5,959,307 A * | 9/1999 | Nakamura et al. ............. 257/14 |
| 6,147,364 A * | 11/2000 | Itaya et al. .................. 257/76 |
| 6,420,733 B2 * | 7/2002 | Koide et al. .................. 257/79 |
| 6,987,285 B2 * | 1/2006 | Nagashima et al. .......... 257/79 |
| 2007/0131950 A1 * | 6/2007 | Takeuchi .................... 257/93 |

* cited by examiner

*Primary Examiner* — Wai Sing Louie
*Assistant Examiner* — Bilkis Jahan
(74) *Attorney, Agent, or Firm* — Birch, Stewart, Kolasch & Birch, LLP

(57) ABSTRACT

Provided are a semiconductor light emitting device and a method of manufacturing the same. The semiconductor light emitting device comprises a first conductive type semiconductor layer, an active layer, a first thin insulating layer, and a second conductive type semiconductor layer. The active layer is formed on the first conductive type semiconductor layer. The first thin insulating layer is formed on the active layer. The second conductive type semiconductor layer is formed on the thin insulating layer.

7 Claims, 7 Drawing Sheets

SEMICONDUCTOR LIGHT EMITTING DEVICE AND METHOD OF MANUFACTURING THE SAME

CROSS-REFERENCE TO RELATED APPLICATIONS

The present application claims priority under 35 U.S.C. 119 to Korean Patent Application No. 10-2007-0080102 (filed on Aug. 9, 2007), which is hereby incorporated by reference in its entirety.

BACKGROUND

The present disclosure relates to a semiconductor light emitting device and a method of manufacturing the same.

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the manufacturing process or a light efficiency of the nitride semiconductor.

SUMMARY

Embodiments provide a semiconductor light emitting device comprising a thin insulating layer on an active layer and a method of manufacturing the same.

Embodiments provide a semiconductor light emitting device comprising a thin insulating layer using a P-type dopant between an active layer and a second conductive type semiconductor layer and a method of manufacturing the same.

Embodiments provide a semiconductor light emitting device, where at least one thin insulating layer is formed between an active layer and an electrode layer to diffuse holes and decrease a leakage current, and a method of manufacturing the same.

An embodiment provides a semiconductor light emitting device comprising: a first conductive type semiconductor layer; an active layer on the first conductive type semiconductor layer; a first thin insulating layer on the active layer; and a second conductive type semiconductor layer on the thin insulating layer.

An embodiment provides a semiconductor light emitting device comprising: a first conductive type semiconductor layer; an active layer on the first conductive type semiconductor layer; a second conductive type semiconductor layer on the active layer; an electrode layer on the second conductive type semiconductor layer; and a thin insulating layer between the active layer and the electrode layer.

An embodiment provides a method of manufacturing a semiconductor light emitting device, the method comprising; forming a first conductive type semiconductor layer; forming an active layer on the first conductive type semiconductor layer; forming a first thin insulating layer on the active layer; and forming a second conductive type semiconductor layer on the first thin insulating layer.

The details of one or more embodiments are set forth in the accompanying drawings and the description below. Other features will be apparent from the description and drawings, and from the claims.

DETAILED DESCRIPTION OF THE EMBODIMENTS

Hereinafter, semiconductor light emitting devices and methods of manufacturing the same in accordance with embodiments will be described with reference to the accompanying drawings. Reference will now be made in detail to the embodiments of the present disclosure, examples of which are illustrated in the accompanying drawings. In the following description, words "above," "one," "below," and "underneath" are based on the accompanying drawings. In addition, a thickness of each layer is only exemplarily illustrated.

Figure 1:
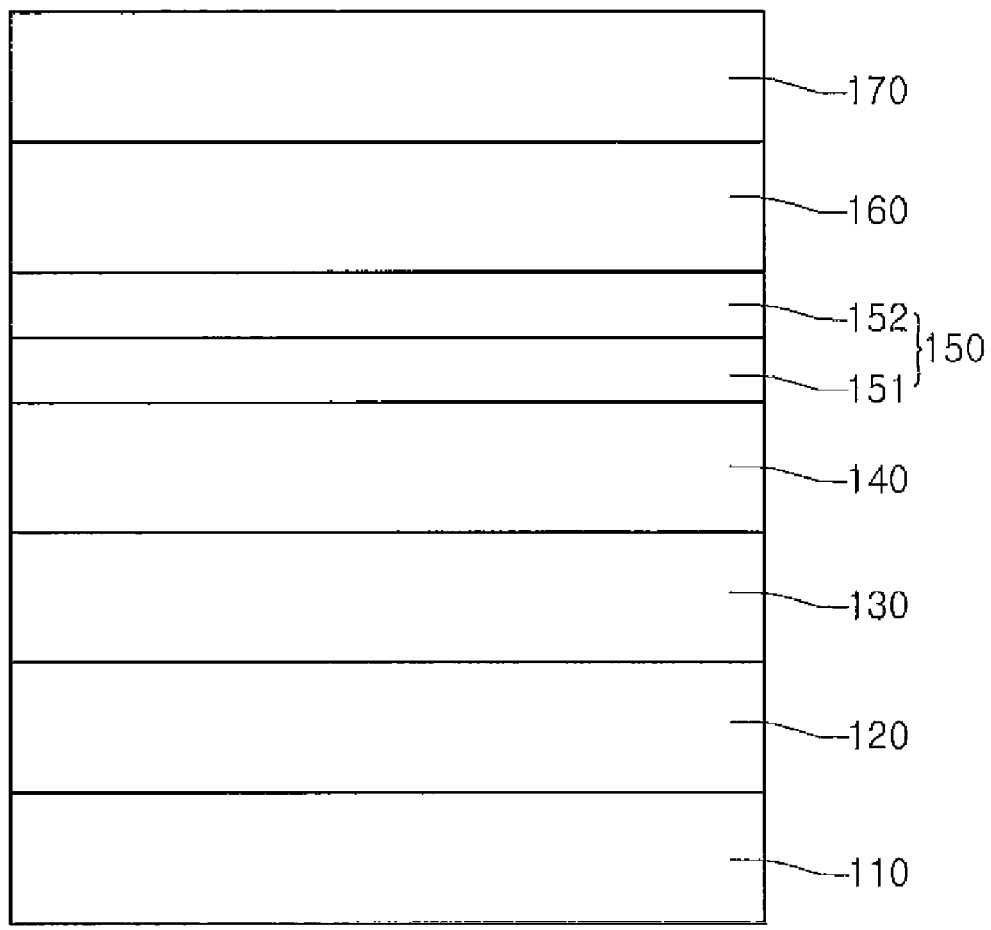
FIG. 1 is a side sectional view of a semiconductor light emitting device according to a first embodiment.

FIG. 1 is a side sectional view of a semiconductor light emitting device according to a first embodiment.

Referring to FIG. 1, a semiconductor light emitting device 100 comprises a substrate 110, a buffer layer 120, an undoped semiconductor layer 130, a first conductive type semiconductor layer 140, an active layer 150, a thin insulating layer 160, and a second conductive type semiconductor layer 170.

The substrate 110 may be formed of one selected from the group consisting of sapphire ($Al_2O_3$), GaN, Sic, ZnO, Si, GaP, GaAs, and InP. Also, the substrate 110 may comprise a conductive substrate. However, a material of the substrate 110 should not be limited thereto.

A nitride semiconductor is grown on the substrate 110 using a growth device. The growth device may comprise an E-beam evaporator, a physical vapor deposition (PVD) apparatus, a chemical vapor deposition (CVD) apparatus, a plasma laser deposition (PLD) apparatus, a dual-type thermal evaporator sputtering apparatus, a metal organic chemical vapor deposition apparatus, but not limited thereto.

The buffer layer 120 is formed on the substrate 110, and the undoped semiconductor layer 130 is disposed on the buffer layer 120. Here, the buffer layer 120 decreases a lattice constant difference between the nitride semiconductor and the substrate 110 and may selectively comprise GaN, AlN, AlGaN, InGaN, or the like. The undoped semiconductor layer 130 may be formed as an undoped GaN layer and serves as a substrate for growth of a nitride semiconductor. At least one or neither of the buffer layer 120 and the undoped semiconductor layer 130 may be formed on the substrate 110, but not limited thereto.

The first conductive type semiconductor layer 140 is formed on the undoped semiconductor layer 130. The first conductive type semiconductor layer 140 may be formed as an electrode contact layer doped with a first conductive type dopant. The first conductive type semiconductor layer 140 may be formed as an N-type semiconductor layer. The N-type semiconductor layer may comprise a compound of a group III element and a group V element, for example, a semiconductor material having a composition ratio of $In_xAl_yGa_{1-x-y}N$ ($0 \leq x \leq 1$, $0 \leq y \leq 1$, $1 \leq x+y \leq 1$). That is, the N-type semiconductor layer may comprise at least one of GaN, InN, AlN, InGaN, AlGaN, InAlGaN, and AlInN. The first conductive type dopant is an N-type dopant, and the N-type dopant comprises Si, Ge, Sn, or the like.

Here, a semiconductor layer doped with a dopant may be disposed between the undoped semiconductor layer 130 and the first conductive type semiconductor layer 140, but not limited thereto.

The active layer 150 is formed on the first conductive type semiconductor layer 140 and has a single quantum well structure or a multiple quantum well structure. For example, the active layer 150 may comprise one cycle or more of a quantum well layer 151 and a quantum barrier layer 152. The quantum well layer 151 may be formed of InGaN, GaN, or InAlGaN, and the quantum barrier layer 152 may be formed of AlGaN, GaN, or InAlGaN, but not limited thereto. A light emitting material of the active layer 150 may vary depending on a light emitting wavelength such as a blue wavelength, a red wavelength, a green wavelength, or the like.

For example, the quantum well layer 151 and the quantum barrier layer 152 may be formed of InGaN and AlGaN, respectively, by selectively supplying $NH_3$, TMGa (or TEGa), trimethylindium (TMIn), and TMAl as a source gas using $N_2$ as a carrier gas at a predetermined growth temperature, e.g., a temperature ranging from about 700° C. to about 950° C. Here, the quantum barrier layer 152 has an N-type semiconductor property although it is not doped. The quantum barrier layer 152 may be disposed as the uppermost layer of the active layer 150, but not limited thereto.

A conductive type cladding layer (not shown) may be formed on/under the active layer 150. The conductive type cladding layer may be formed as an AlGaN layer.

The thin insulating layer 160 is formed on the active layer 150, and the second conductive type semiconductor layer 170 is formed on the thin insulating layer 160. Here, the thin insulating layer 160 is formed on the quantum barrier layer 152 of the active layer 150.

The thin insulating layer 160 is a thin layer with an insulating property, and may serve as a high resistive layer and a low conductive layer compared with the second conductive type semiconductor layer 170.

The thin insulating layer 160 may be doped with a very small amount of a P-type dopant such as Mg, Zn, Ca, Sr, or Ba, or a group II element. The thin insulating layer 160 may be a GaN thin insulating layer. For example, the GaN thin insulating layer may be formed by supplying $NH_3$ and TMGa (or TEGa) as a source gas and supplying a P-type dopant such as Mg at a predetermined temperature, e.g., 900° C. or more. The GaN thin insulating layer comprises a p-type carrier concentration ranging from about $5 \times 10^{17}/cm^3$ to about $5 \times 10^{18}/cm^3$. Here, an undoped GaN layer comprises N-type carriers of about $5 \times 10^{16}/cm^3$ though it is not intentionally doped. Therefore, a very small amount of the P-type dopant is provided in order to remove the N-type property when the GaN thin insulating layer is grown. Accordingly, the GaN thin insulating layer can have a insulating property.

A hole concentration of the thin insulating layer 160, (that is, a background hole concentration) may be about $5 \times 10^{18}/cm^3$ or less. The background hole concentration means a hole concentration of the uppermost quantum barrier layer of the active layer 150, and the hole concentration of the thin insulating layer 160 may be the hole concentration of the quantum barrier layer 152, that is, about $5 \times 10^{18}/cm^3$ or less.

The thin insulating layer 160 may be formed to a thickness ranging from about 1 nm to about 9 nm. Since the thin insulating layer 160 has properties of an insulating layer and a high resistive layer, holes that move from the second conductive type semiconductor layer 170 to the active layer 150 may move in vertical and horizontal directions in the thin insulating layer 160. That is, since the movement speed of the holes in a horizontal direction is higher than that in a vertical direction in the thin insulating layer 160, the holes to move to the active layer 160 can be blocked and diffused.

Also, although the thin insulating layer 160 is formed as the GaN thin layer, it may be formed as an insulating layer using at least one of compound semiconductors such as GaN, InN, AlN, InGaN, AlGaN, InAlGaN, or AlInN.

The second conductive type semiconductor layer 170 may be disposed as an electrode contact layer doped with a second conductive type dopant on the thin insulating layer 160. The second conductive type semiconductor layer 170 may be formed as a P-type semiconductor layer, and the P-type semiconductor layer may selectively comprise GaN, InN, AlN, InGaN, AlGaN, InAlGaN, AlInN, or the like. The second conductive type dopant is a P-type dopant, and the P-type dopant comprises Mg, Zn, Ca, Sr, Ba, or the like. The second conductive type semiconductor layer 170 may have a doping concentration of about $5 \times 10^{17}/cm^3$ or more and a thickness ranging from about 500 Å to about 1000 Å, but not limited thereto.

An N-type semiconductor layer may be disposed as a third conductive type semiconductor layer (not shown) on the second conductive type semiconductor layer 170. In the first embodiment, the first conductive type semiconductor layer 140 is an N-type semiconductor layer and the second conductive type semiconductor layer 170 is a P-type semiconductor layer, but a reverse structure thereof may be formed. A light emitting structure according to the embodiments may comprise one of a P-N junction, an N-P junction, an N-P-N junction, and a P-N-P junction.

A transparent electrode layer may be formed on the second conductive type semiconductor layer 170, and a second electrode layer is formed on the transparent electrode layer. Here, in the case of an N-P-N junction structure, the transparent electrode layer may be disposed on the third conductive type semiconductor layer that is the N-type semiconductor layer.

In the semiconductor light emitting device 100, since the thin insulating layer 160 is disposed between the active layer 150 and the second conductive type semiconductor layer 170, a current scarcely flows at a low voltage of about 2.5 V or less and an operating current using tunneling flows at only about 3 V or more. Also, since the holes are diffused in the thin insulating layer 160 and are injected into the active layer 150, the active layer 150 can improve optical characteristics such as the internal quantum efficiency. In addition, light can be emitted uniformly in an entire region of the active layer 150.

Figure 2:
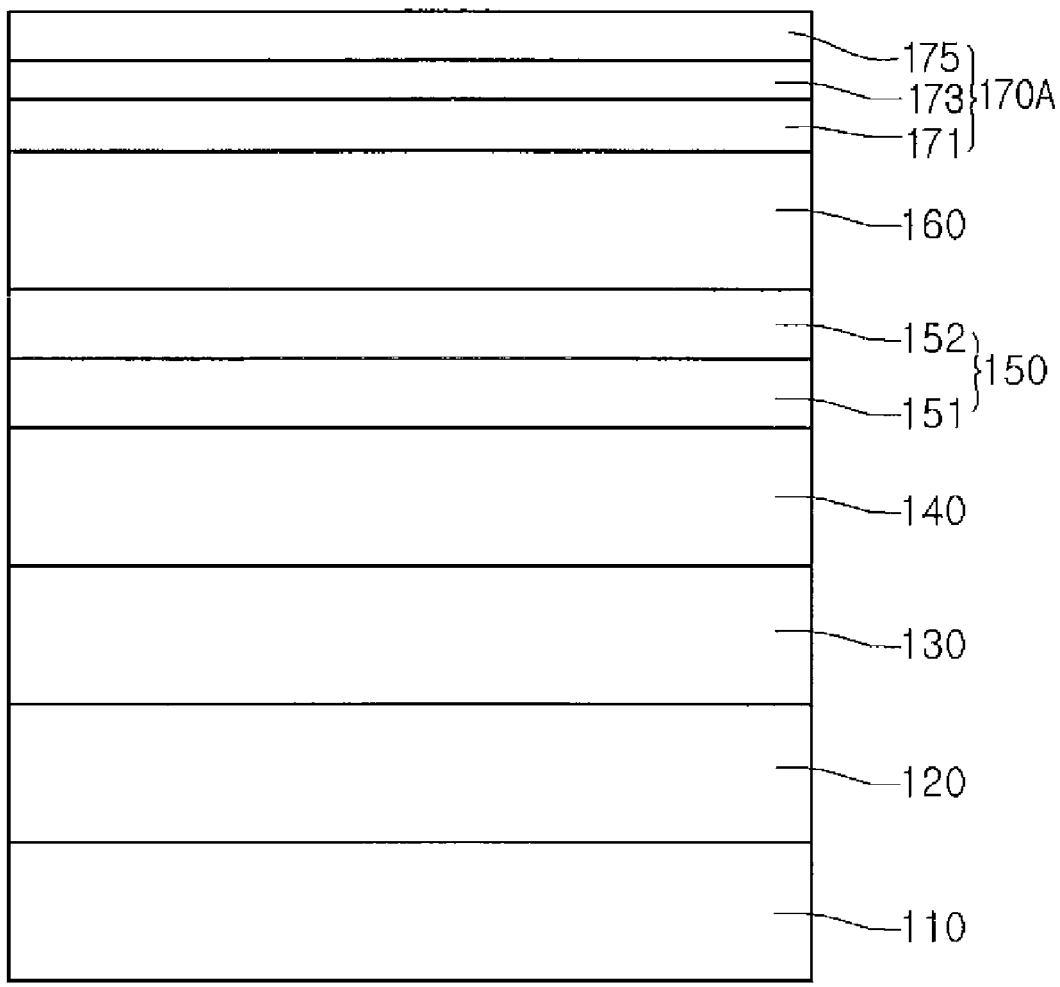
FIG. 2 is a side sectional view of a semiconductor light emitting device according to a second embodiment.

FIG. 2 is a side sectional view of a semiconductor light emitting device according to a second embodiment. Like reference numerals refer to like elements in the first and second embodiments, and the same descriptions thereof will be omitted.

Referring to FIG. 2, a semiconductor light emitting device 100A comprises a substrate 110, a buffer layer 120, an undoped semiconductor layer 130, a first conductive type semiconductor layer 140, an active layer 150, a first thin insulating layer 160, and a second conductive type semiconductor layer 170A comprising a second thin insulating layer 173.

The first thin insulating layer 160 is formed between the active layer 150 and the second conductive type semiconductor layer 170A. The first embodiment may be referred to for the first thin insulating layer 160.

The second conductive type semiconductor layer 170A comprises a second A conductive type semiconductor layer 171, the second thin insulating layer 173, and a second B conductive type semiconductor layer 175. The second A conductive type semiconductor layer 171 and the second B conductive type semiconductor layer 175 may be formed as a P-type semiconductor layer doped with a P-type dopant. The second conductive type semiconductor layer 170A may have a doping concentration of about $5 \times 10^{17}/cm^3$ and a thickness ranging from about 500 Å to about 1000 Å, but not limited thereto.

The second thin insulating layer 173 may be formed between the second A conductive type semiconductor layer 171 and the second B conductive type semiconductor layer 175. The second thin insulating layer 173 has an insulating property. Also, the second thin insulating layer 173 may serve as a high resistive layer and a low conductive layer, compared with the second A conductive type semiconductor layer 171 and the second B conductive type semiconductor layer 175.

The second thin insulating layer 173 is doped with a very small amount of a P-type dopant or a group II element to have an insulating property. Here, the second thin insulating layer 173 may be doped with a P-type carrier concentration ranging from about $5 \times 10^{17}/cm^3$ to about $5 \times 10^{18}/cm^3$ to have a hole concentration of about $5 \times 10^{18}/cm^3$ or less. A thickness of the second thin insulating layer 173 may be greater than about 0 nm, and less than or equal to about 9 nm.

The second thin insulating layer 173 may comprise at least one of compound semiconductors such as GaN, InN, AlN, InGaN, AlGaN, InAlGaN, or AlInN.

The second thin insulating layer 173 diffuses holes injected through the second B conductive type semiconductor layer 175, and then the first thin insulating layer 160 diffuses the holes injected through the second A conductive type semiconductor layer 171. Therefore, the holes injected into the active layer 150 can be diffused uniformly, thereby improving the internal quantum efficiency.

Also, each thin insulating layer may be disposed between second conductive type semiconductor layers. In addition, the thin insulating layer may be disposed between the second conductive type semiconductor layer and a transparent electrode layer. The forming position and the number of the thin insulating layer may be modified in the scope of spirits of the embodiments.

Figure 3:
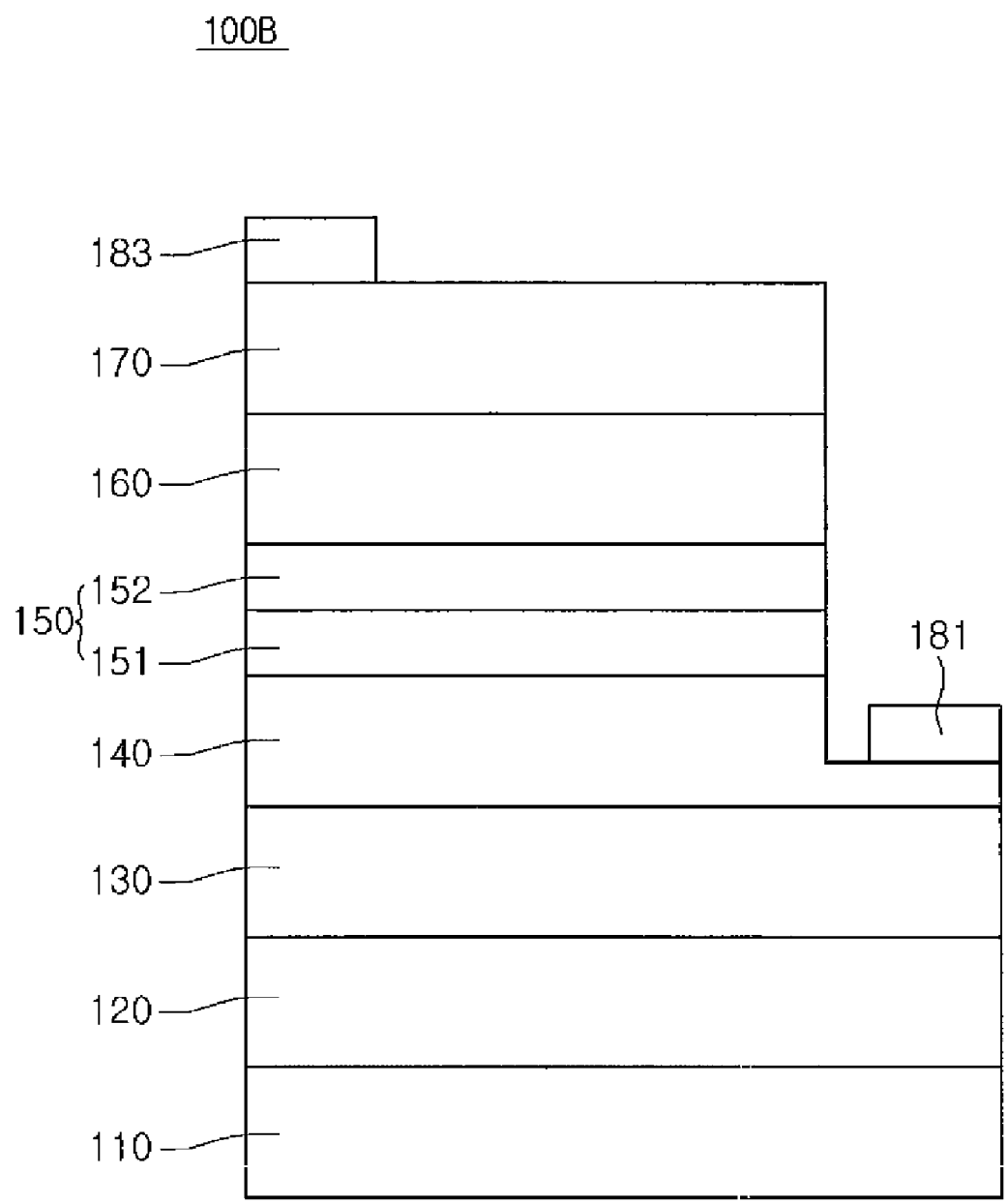
FIG. 3 is a side sectional view of a lateral semiconductor light emitting device using FIG. 1.

FIG. 3 is a side sectional view of a lateral semiconductor light emitting device using FIG. 1.

Referring to FIG. 3, a lateral semiconductor light emitting device 100B comprises a first electrode layer 181 on the first conductive type semiconductor layer 140 and a second electrode layer 183 on the second conductive type semiconductor layer 170. When a forward current is applied to the first electrode layer 181 and the second electrode layer 183, holes injected through the second conductive type semiconductor layer 170 are diffused in the thin insulating layer 160, and then injected into the active layer 150. Therefore, the holes can be injected uniformly in an entire region of the active layer 150, thereby improving the internal quantum efficiency.

Figure 4:
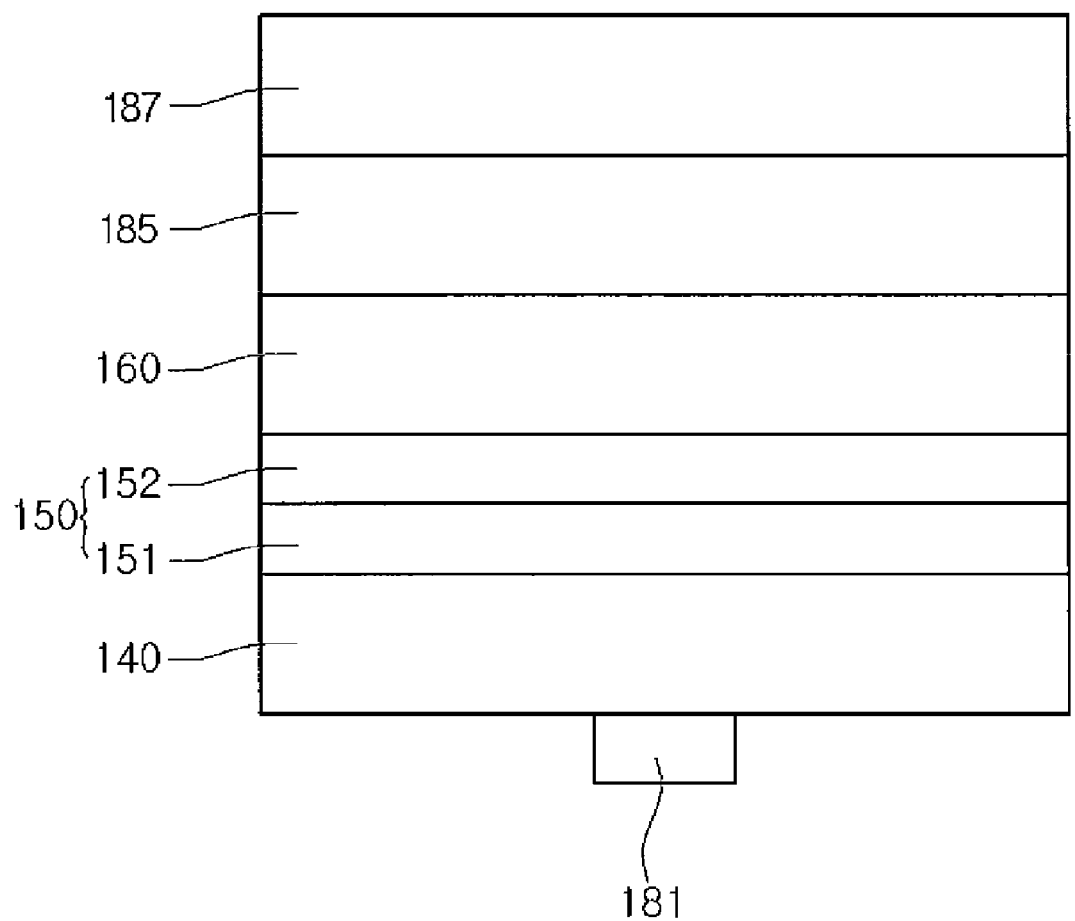
FIG. 4 is a side sectional view of a vertical semiconductor light emitting device using FIG. 1.

FIG. 4 is a side sectional view of a vertical semiconductor light emitting device using FIG. 1.

Referring to FIG. 4, a vertical semiconductor light emitting device 100C comprises a reflective electrode layer 185 on the second conductive type semiconductor layer 170 and a conductive supporting substrate 187 on the reflective electrode layer 185. The reflective electrode layer 185 may be formed of one selected from Al, Ag, Pd, Rh, and Pt, and the conductive supporting substrate 187 may be formed of copper or gold, but not limited thereto.

Here, the substrate 110, the buffer layer 120, and the undoped semiconductor layer 130 that are illustrated in FIG. 1 are removed using a physical or/and chemical method. According to the physical method, the substrate 110 may be separated by applying a laser with a predetermined wavelength to the substrate 110, and the buffer layer 120 may be removed using wet or dry etching. According to the chemical method, the substrate 110 may be separated by injecting an etchant into the buffer layer 120. The buffer layer 120 and the undoped semiconductor layer 130 may be removed using chemical etching. A first electrode layer 181 may be formed under the first conductive type semiconductor layer 140.

Figure 5:
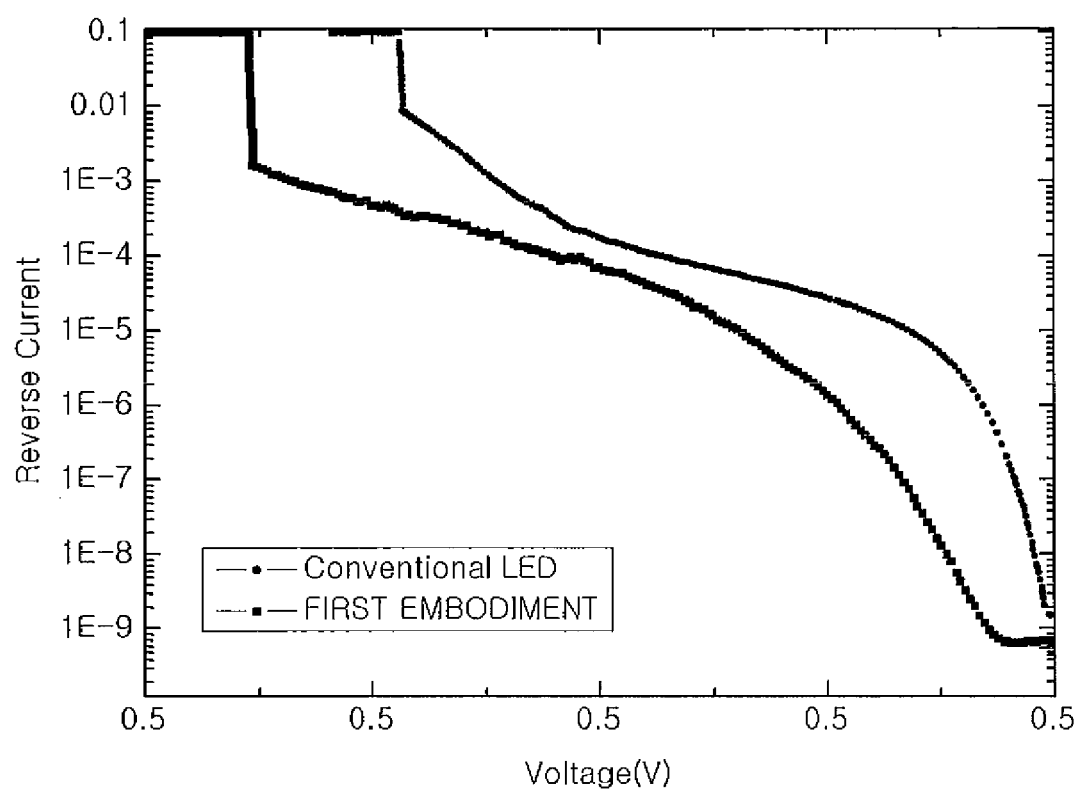
FIG. 5 is a reverse current versus voltage graph for a related art LED and an LED according to a first embodiment.
Figure 6:
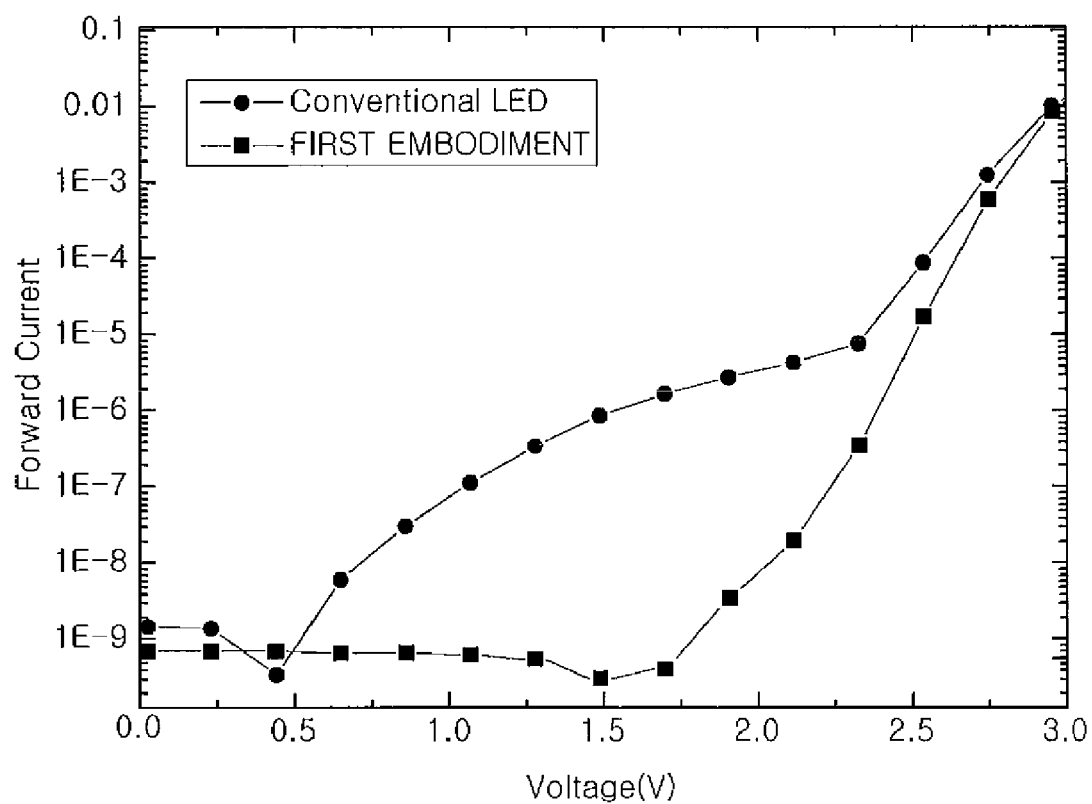
FIG. 6 is a forward current versus voltage graph for a related art LED and an LED according to a first embodiment.

FIG. 5 is a reverse current versus voltage graph for a related art LED and an LED according to the first embodiment, and FIG. 6 is a forward current versus voltage graph for a related art LED and an LED according to the first embodiment.

Referring to FIGS. 5 and 6, under the same voltage condition, a forward current and a reverse current of the LED of FIG. 1 are lower than those of the related art LED. Therefore, the LED of FIG. 1 can decrease the leakage current.

Also, referring to FIG. 6, a current scarcely flows at a low voltage, e.g., about 2 V or less, and flows at about 3 V, which is an operating voltage of the LED, or more. That is, a current flows by tunneling at about 3 V or more in the LED of FIG. 1.

Figure 7:
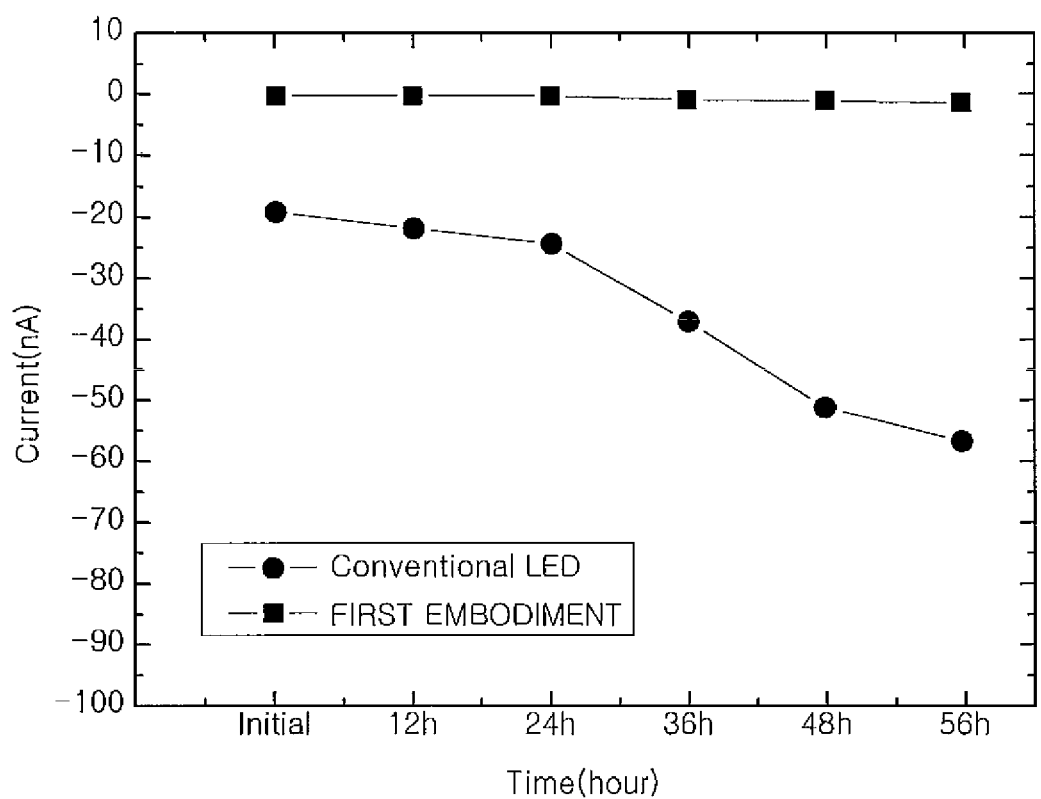
FIG. 7 is a graph showing a reliability test for a related art LED and an LED according to a first embodiment for a predetermined time.

FIG. 7 is a graph showing a reliability test for a related art LED and an LED according to the first embodiment for a predetermined time.

Referring to FIG. 7, a current constantly flows for a long time in the LED according to the first embodiment, thereby improving the reliability, compared with the related art LED.

In descriptions of the embodiments, it will be understood that when a layer (or film), a region, a pattern, or components is referred to as being 'on' or 'under' another substrate, layer (or film), region, or patterns, it can be directly on the other layer or substrate, or intervening layers may also be present. Also, in the descriptions of the embodiments, sizes of elements illustrated in drawings are one example, and the present disclosure is not limited to the illustrated drawings.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
   a first conductive type semiconductor layer;
   an active layer formed on the first conductive type semiconductor layer;
   a second conductive type semiconductor layer including a first semiconductor layer formed on the active layer and a second semiconductor layer formed on the first semiconductor layer;
   a third semiconductor layer formed between the first semiconductor layer and the second semiconductor layer; and
   a fourth semiconductor layer formed between the first semiconductor layer and the active layer, wherein the third semiconductor layer has a P-type dopant concentration less than a P-type dopant concentration of the second semiconductor layer and the fourth semiconductor layer has a P-type dopant concentration less than a P-type dopant concentration of the first semiconductor layer, wherein the third semiconductor layer has a hole concentration of about $5\times10^{18}/cm^3$ or less and has a thickness of greater than 0 nm and less than or equal to about 9 nm.

2. The semiconductor light emitting device according to claim 1, wherein the third semiconductor layer and the fourth semiconductor layer each serve as a high resistive layer and a low conductive layer compared with the first semiconductor layer and the second semiconductor layer.

3. The semiconductor light emitting device according to claim 1, wherein the third semiconductor layer and the fourth semiconductor layer comprise at least one of GaN, InN, AlN, InGaN, AlGaN, InAlGaN, and AlInN.

4. The semiconductor light emitting device according to claim 1, wherein the third semiconductor layer and the fourth semiconductor layer are each formed as an insulating layer by a P-type dopant, and the fourth semiconductor layer has a hole concentration of about $5\times10^{18}/cm^3$ or less.

5. The semiconductor light emitting device according to claim 4, wherein the third semiconductor layer and the fourth semiconductor layer each has the hole concentration of about $5\times10^{17} \sim 5\times10^{18}/cm^3$.

6. The semiconductor light emitting device according to claim 1, wherein a thickness of the fourth semiconductor layer is greater than 0 nm and less than or equal to about 9 nm.

7. The semiconductor light emitting device according to claim 1, wherein the third and fourth semiconductor layers have the same material as the first semiconductor layer.

* * * * *